United States Patent [19]

Harada et al.

[11] 3,946,223

[45] Mar. 23, 1976

[54] CHARGE TRANSFER DEVICE HAVING CONTROL MEANS FOR ITS PHOTOELECTRIC CONVERSION CHARACTERISTICS

[75] Inventors: Nozomu Harada, Yokohama; Mineo Iwasawa, Hayama, both of Japan

[73] Assignee: Tokyo Shibaura Electric Co., Ltd., Japan

[22] Filed: Oct. 25, 1974

[21] Appl. No.: 518,197

[30] Foreign Application Priority Data
Oct. 26, 1973  Japan.............................. 48-119996

[52] U.S. Cl. ......... 250/211 J; 307/221 D; 307/311; 357/31
[51] Int. Cl.²........................................ H01L 31/00
[58] Field of Search........ 250/211 J, 211 R; 357/24, 357/30, 31; 307/221 D, 304, 311; 178/7.2

[56] References Cited
UNITED STATES PATENTS

| | | |
|---|---|---|
| 3,826,926 | 7/1974 | White et al. .................... 307/221 D |
| 3,840,740 | 10/1974 | Stewart ............................ 250/211 J |
| 3,863,065 | 1/1975 | Kosonocky et al. .............. 357/24 X |
| 3,866,067 | 2/1975 | Ameilo........................... 250/211 J X |

Primary Examiner—Archie R. Borchelt
Assistant Examiner—E. R. La Roche
Attorney, Agent, or Firm—Cushman, Darby & Cushman

[57] ABSTRACT

A charge transfer device having control means for its photoelectric conversion characteristics comprises means for applying a first integration voltage having a prescribed level to integration electrodes of the device during a prescribed initial time length of a given carrier integration period of one frame period, and means for applying during the remaining integration period a second integration voltage having a level higher than the level of the first integration voltage at the terminating time point of said initial period to said integration electrodes.

6 Claims, 21 Drawing Figures

CHARGE TRANSFER DEVICE HAVING CONTROL MEANS FOR ITS PHOTOELECTRIC CONVERSION CHARACTERISTICS

BACKGROUND OF THE INVENTION

This invention relates to a charge transfer device constituting an image pickup apparatus, and more particularly to a charge transfer device provided with means for controlling the photoelectric conversion characteristics so as to obtain an output made suitable for the image pickup apparatus in accordance with the intensity of light from a foreground subject.

The charge transfer device has already been proposed as a "Charge Coupled Device" (which is hereinafter abbreviated to "CCD") or "Bucket Brigade Device" (which is hereinafter abbreviated to "BBD"). The "CCD" is proposed by W. S. Boyle et al in the treatises "Charge Coupled Semiconductor Device" and "Experimental Verification of the Charge Coupled Device Concept" appearing at pages 587 to 600 of "The Bell System Technical Journal" issued April 19, 1970.

For convenience of explanation of this invention, the fundamental construction and the operation principle of a prior art "CCD" will hereinafter be described by reference to FIGS. 1 and 2. FIG. 1-A shows the construction of the "CCD" of an N channel type-3 phase driving system. As shown in FIG. 1-A, an insulating film 2 is provided on a P type semiconductor substrate 1. On the insulating film 2 are arranged a plurality of electrodes $3a, 4a, 5a, 3b, 4b, 5b, ... 3n, 4n$ and $5n$ in the order mentioned. Electrode conductors $\phi 1, \phi 2$ and $\phi 3$ are connected to the electrodes $(3a, 3b, ... 3n), (4a, 4b, ... 4n)$ and $(5a, 5b, ... 5n)$, respectively. Each electrode conductor is supplied with a voltage having such a waveform as is illustrated in FIG. 2 from a driving voltage source 6. The maximum level $V_2$ and the minimum level $V_0$ of each voltage waveform are both positive and bear the relationship of $V_0 < V_2$. T1, T2 and T3 represent one frame period, integration period and transfer and readout period, respectively. In the integration period $T_2$, when a voltage $V_2$ is applied to the electrode conductor $\phi 1$ and a voltage $V_0$ to the remaining electrode conductors $\phi 2$ and $\phi 3$, potential wells $7a, 7b, ... 7n$ are produced in the semiconductor substrate below the integration electrodes $3a, 3b, ... 3n$ (FIG. 1-A). When, under this condition, the optical image of a foreground subject (not shown) is focussed on the semiconductor substrate 1 via a lens not shown, electron-hole pairs $8a, 8b, ... 8n$ corresponding to the brightness of the optical image are produced in the substrate 1. The minority carriers of the electron-hole pairs, namely, electrons $9a, 9b, ... 9n$ are shifted by diffusion to the potential wells in the proximity of the electron-hole pairs and are integrated therein.

When, after completion of said integration, the voltages $V_1, V_2$ and $V_0$ ($V_0 < V_1 < V_2$) are applied to the electrode conductors $\phi 1, \phi 2$ and $\phi 3$, respectively, such a potential distribution as is indicated by a numeral 10 of FIG. 1-B is obtained with the result that the integrated electrons $9a, 9b, ... 9n$ start to be shifted to the potential wells produced below the electrodes $4a, 4b, ... 4n$ as shown by arrows. When the voltage $V_0$ is applied to the electrode conductors $\phi 1$ and $\phi 3$ and the voltage $V_2$ to the electrode conductor $\phi 2$ (FIG. 1-C) after the substantial completion of electron shifting, transference of the electrons $9a, 9b, ... 9n$ to the potential wells $11a, 11b, ... 11n$ is completed. Through applying a voltage having such a waveform as is shown in, for example, FIG. 2 to the electrode conductors $\phi 1, \phi 2$ and $\phi 3$ during the transfer and readout period T3 the integrated electrons $9a, 9b, ... 9n$ are sequentially drawn out as video signals from the output terminal 16 by readout means including, for example, a diode 13 consisting of an $N^+$ region and an electrode 12, DC source 14 and output resistor 15. A reference numeral 18 denotes an amplifier. The video signals from the output terminal 16 are transmitted to the image display means of the image pickup apparatus via amplifier means thereof, and the displayed image is monitored there.

In some cases, the ratio of the brightness of the lightest portion of a foreground subject to be displayed as an image of a television camera to the brightness of the darkest portion of the foreground subject, that is, the contrast ratio (or contrast range) indicates more than $10^3 : 1$. However, the contrast ratio of a reproduced television image is normally limited to 20 : 1 to 30 : 1. In other words, in the television, the reproduced image bearing part of the contrast ratio of a foreground subject can only be obtained.

However, where it is desired to make a reproduced image easy to see, the image reproduction has to be so performed as to cause the foreground subject to fall for the most part within said reproducible contrast ratio. To this end, for example, adjustment of the iris diaphragm of an image pickup lens is generally carried out. That portion of the foreground subject which has a brightness exceeding the upper limit of said reproducible contrast ratio causes production of an image signal output having a large amplitude, so that excess modulation is caused in the transmitter, or the video amplifier is saturated to cause the amplifying function thereof to be temporarily stopped. Consequently, contrast depression is required in effecting the image pickup.

As the methods for effecting the contrast depression there are known (1) the method of performing the image pickup through an optical element whose light transmissivity is varied in accordance with the intensity of light incident into the camera from a foreground subject, (2) the method of effecting the contrast depression within an image signal processing circuit, and (3) the method of effecting the contrast depression by an image pickup element itself. As the last-mentioned method (3) there are known the method of utilizing the knee pattern of the photoelectric conversion characteristic of an image orthicon and the method of utilizing the Anti-Comet Tail Operation of the "Plumbicon."

When the contrast depression is carried out by the image pickup element, it is desirable that the intensity of an incident light corresponding to the knee point of the photoelectric conversion characteristic of said element is controllable and that the inclination of the photoelectric conversion characteristic portion beyond said knee point of the photoelectric conversion characteristic (the contrast compression ratio varies with said inclination) is controllable.

Where image pickup is performed by three pickup tubes of R.G.B. (Red; Green; Blue), the respective operating points (the respective levels of the knee points) of the three pickup tubes do not coincide with each other. Accordingly, the respective levels of the output signals of the three pickup tubes are not equalized. Under these circumstances, the level correction is usually performed by controlling the gain of the video amplifier. When said knee point levels and inclinations of said three pickup tubes are different, an undesirable coloring takes place in the reproduced image owing to the contrast depression. In other words, a good color reproducibility is not achieved. The foregoing description was made by taking the image pickup tube as an example. But a charge transfer device having satisfactory means for satisfactorily controlling the photoelectric conversion characteristic has not yet been proposed.

Accordingly, the object of the invention is to provide a charge transfer device having new satisfactory means for controlling the photoelectric conversion characteristic as desired.

SUMMARY OF THE INVENTION

The charge transfer device of the invention comprises a semiconductor substrate provided with a plurality of electrodes for carrier integration and transference, means for integrating carriers produced in said substrate in accordance with the intensity of light irradiated thereto by applying an integration voltage to said electrodes for carrier integration during a given length of period for carrier integration, and carrier transfer and readout means for transferring the integrated carriers by applying a transfer voltage to said electrodes for carrier transference and sequentially reading out the transferred carriers as video signals, and further comprises control means for controlling the photoelectric conversion characteristic having means for applying a first integration voltage having a prescribed level to said integration electrodes during a prescribed length of initial period of said given length of period for carrier integration and means for applying a second integration voltage having a level higher than the level of said first integration voltage at the terminating time point of said initial period to said integration electrode during the remaining period of said given length of period for carrier integration.

According to the invention, desired photoelectric conversion characteristics can be obtained by previously setting the period during which the first integration voltage is applied, the amplitude of the first integration voltage and that of the first integration voltage at said terminating time point to a prescribed length and levels, respectively. Further, in accordance with the intensity of light irradiated to the substrate positions corresponding to the potential wells produced before the light irradiation, the amount of carriers being finally integrated in said potential wells can be limited to a prescribed value. That is, the contrast control can be effected per potential well position in accordance with the intensity of lights irradiated to the potential well position.

DESCRIPTION OF THE PREFERRED EMBODIMENT

Figure 1:
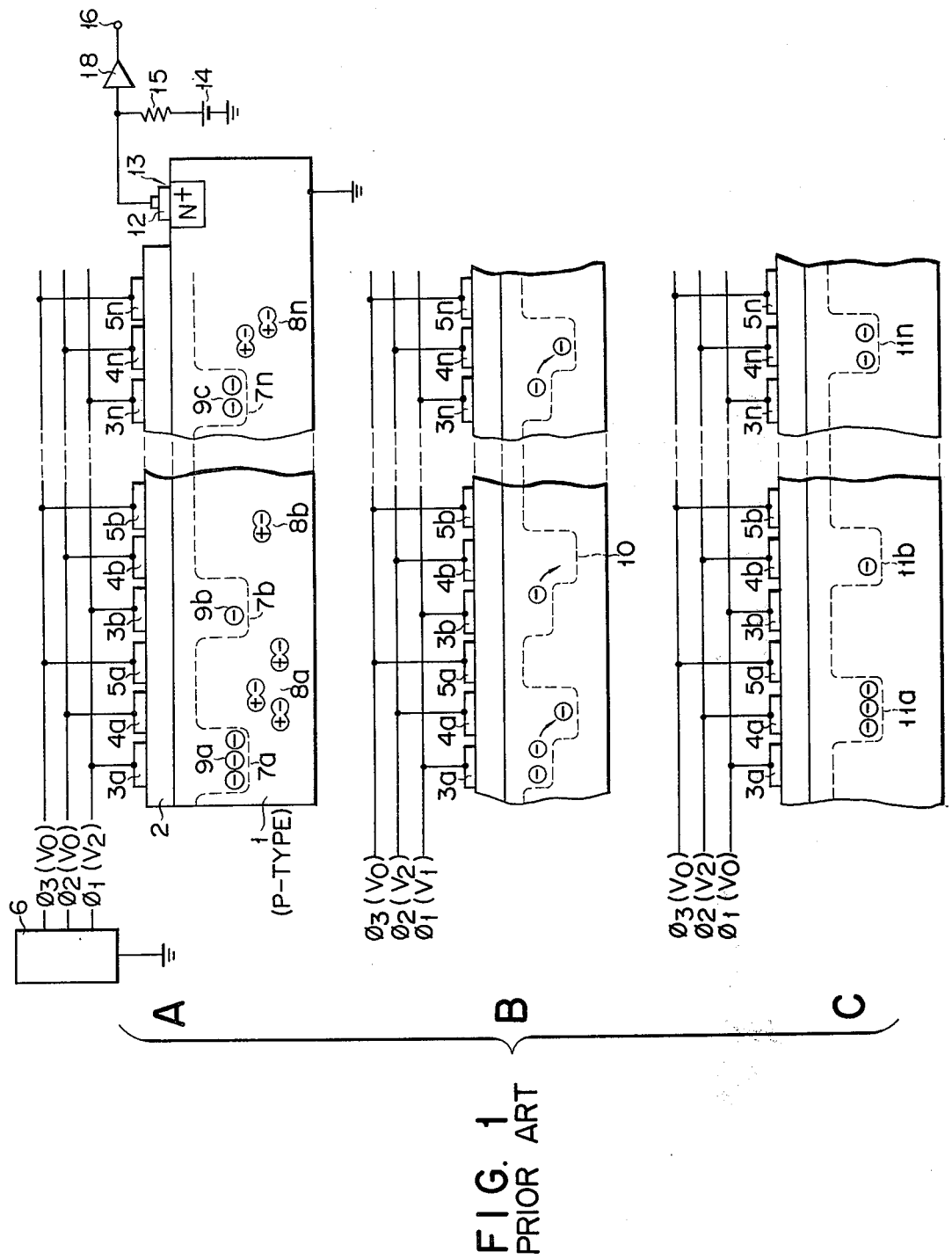
FIGS. 1-A, 1-B and 1-C show a typical constructive example of a prior art "CCD" explaining the principle of integrating, transferring and reading out carriers.
Figure 2:
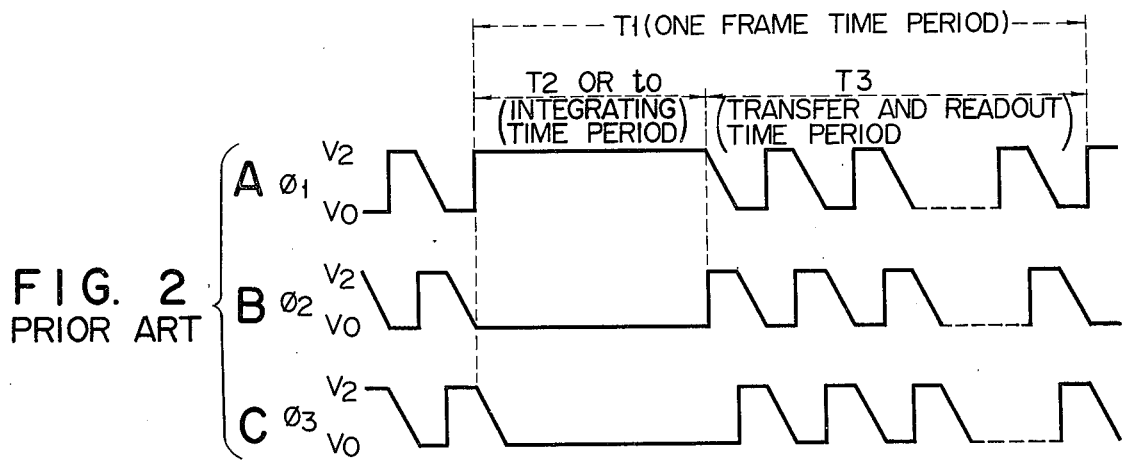
FIGS. 2-A, 2-B and 2-C respectively illustrate the waveform of a driving voltage for driving the "CCD" of FIG. 1.
Figure 3:
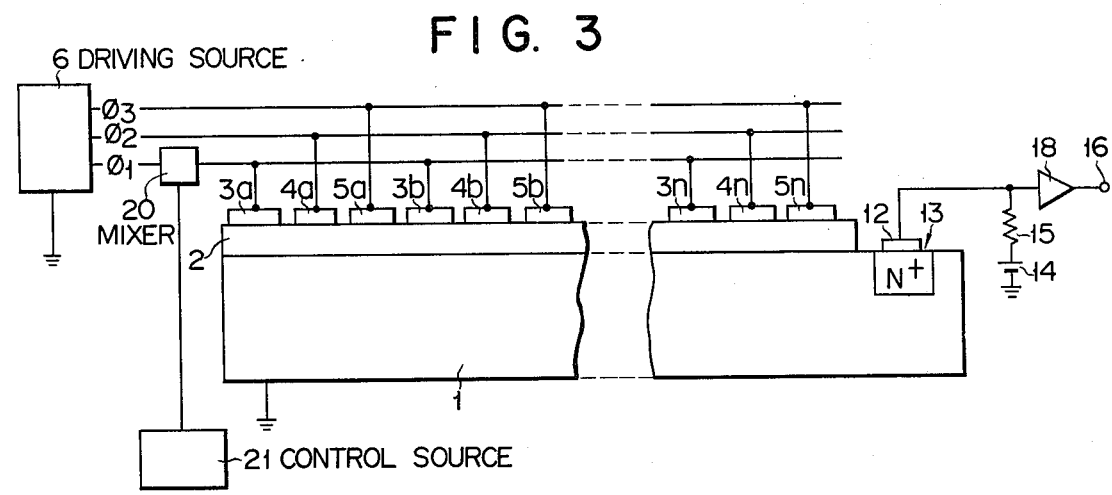
FIG. 3 illustrates an embodiment of a charge transfer device of the invention.

A charge transfer device illustrated in FIG. 3 is the same as a prior art "CCD" illustrated in FIG. 1 except for an integration voltage being applied to integration electrodes $3a$, $3b$, ... $3n$. Therefore, the same parts and sections as those of FIG. 1 are denoted by the same reference numerals, and description thereof is omitted. The voltage waveforms being supplied to electrode conductors $\phi 2$ and $\phi 3$, illustrated in FIGS. 4-B and 4-C are the same as those illustrated in FIGS. 2-B and 2-C. Since, however, an electrode conductor $\phi 1$ (which is supplied with a voltage whose waveform is shown in FIG. 2-A) connected to a driving voltage source is connected through a mixer 20 to the integration electrodes $3a$, $3b$, ... $3n$. A control power source 21 for supplying voltage of the waveform illustrated in FIG. 5-B to the mixer for the purpose of allowing the output of the mixer to have the waveform illustrated in FIG. 4-A is provided. The type and output waveform of the control power source 21 will later be described. For the purpose of varying the width and height $-(V_2 - V_p)$ of a pulse 22 illustrated in FIG. 5-B, a monomultivibrator circuit can be used. For the purpose of varying the phase of the pulse 22, a Pulse Phase Modulation Circuit (which is hereinafter abbreviated to "P.P.M" circuit) using the monomultivibrator circuit can be used. When the mixer 20 is supplied with the output (FIG. 5-A) of a driving voltage source 6 and the output (FIG. 5-B) of the control power source 21, the integration electrodes $3a$, $3b$, $3n$ are respectively impressed with a voltage having the waveform illustrated in FIG. 4-A.

In the voltage waveform illustrated in FIG. 4-A, when the starting point and terminating point of a fixed length of integration period T2 (which is hereinafter referred as "to") are represented by P1 and P4, respectively, and points of time P2 and P3 are set therebetween, the period from P1 to P2 and the period from P3 to P4 can be expressed by tp and Δtp, respectively. In this invention, the period from P1 to P3, namely the period expressed by (to − Δp) is termed the "initial period" of the integration period. As seen from FIG. 4-A, the level $V_2$ of an integration voltage during the period Δtp is chosen to be higher than the level Vp of an integration voltage at the terminating point P3 of the initial period. If the level of the pulse 22 illustrated in FIG. 5-B is chosen to have a value −($V_2$ − Vp), the voltage level within the period from P2 to P3 of FIG. 4-A will have a value of Vp.

The amount of integrated carriers at the point P4 of time is transferred during the period T3. Accordingly, if the relationship between the effective intensity of light irradiated from a foreground subject and the amount of carriers integrated during the period to is determined, the reason will be understood that the photoelectric conversion characteristic can be controlled by the integration voltage illustrated in FIG. 4-A.

Reference notes utilized upon explanation of the above-mentioned relationship are defined as follows.

I: the effective intensity of light irradiated from a foreground subject.

Q: the amount of carriers integrated in the potential well, as generally expressed.

Figure 4:
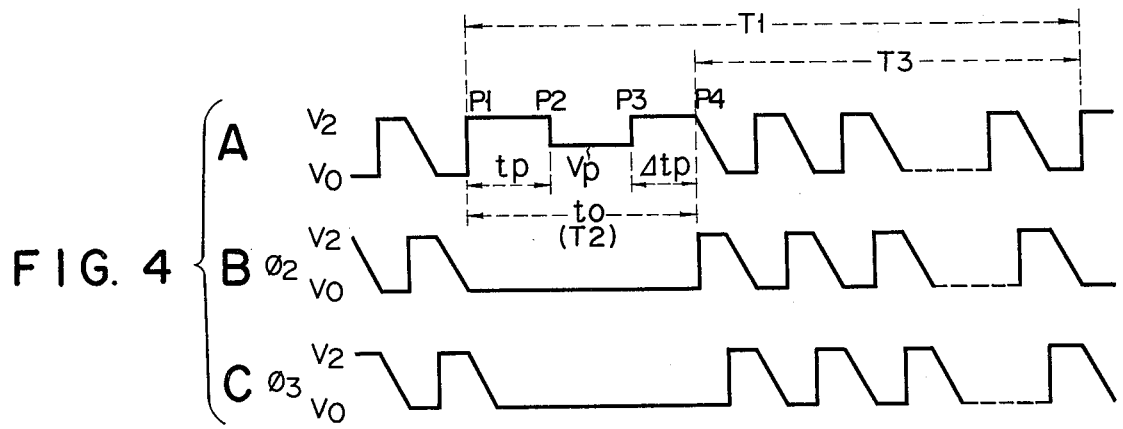
FIGS. 4-A, 4-B and 4-C respectively illustrate an embodiment of waveforms of a driving voltage for driving the charge transfer device illustrated in FIG. 3.
Figure 5:
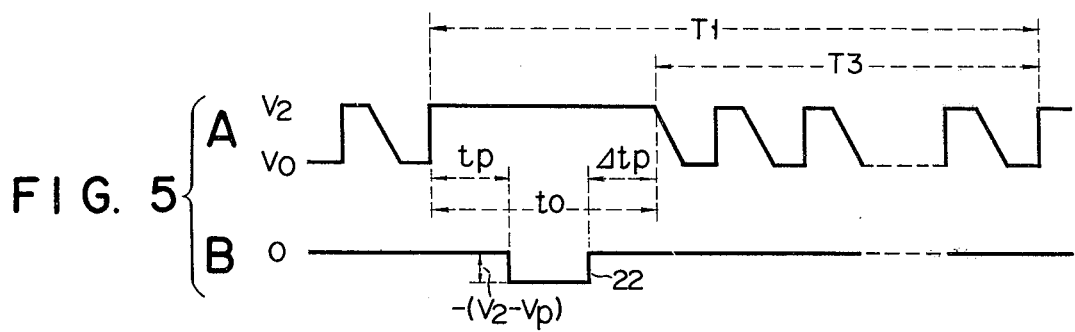
FIGS. 5-A and 5-B respectively illustrate a waveform for obtaining the integration voltage waveform illustrated in FIG. 4-A.

Qp: the maximum amount of carriers integrated during the period from P2 to P3 of FIG. 4-A.

Qo: the maximum amount of carriers capable of being integrated in a potential well during the integration period to. After parameters adopted in manufacturing a semiconductor element constituting the "CCD" are determined, the maximum amount Qo is determined by the maximum level of the integration voltage.

Qf: the amount of integrated carriers at the terminating point (P4) of the period to of FIG. 4-A.

Cox: the capacitance of an oxide film below the integration electrode.

$V_2$: the maximum level of a voltage during the period T2 of FIG. 4-A.

$V_0$: the minimum level of a voltage during the period T2 of FIG. 4-A.

Vp: the voltage level during the period from P2 to P3 of FIG. 4-A, bearing the relationship of $V_0 < Vp < V_2$.

Before explanation of the action of the charge transfer device according to the invention, the photoelectric conversion characteristic of a prior art "CCD" will hereinafter be described by reference to FIG. 2. Where the voltage level $V_0$ illustrated in FIG. 2-A is higher than the inversion voltage Vth, the following equation (1) will result.

$$Qo = Cox (V_2 - V_0) \ldots \quad (1)$$

Where the amount of carriers ΔQ integrated in a potential well for a unit time Δt within the integration period to is kept constant, namely, where I presents no variation throughout the integration period to, the amount of integrated carriers Qf at the terminating point of time of the period to will be expressed by the equation:

$$Qf = I \times to \ldots \quad (2)$$

provided that $$\frac{\Delta Q}{\Delta t} \leq \frac{Qo}{to} \text{ and } I = \frac{\Delta Q}{\Delta t}.$$

Figure 6:
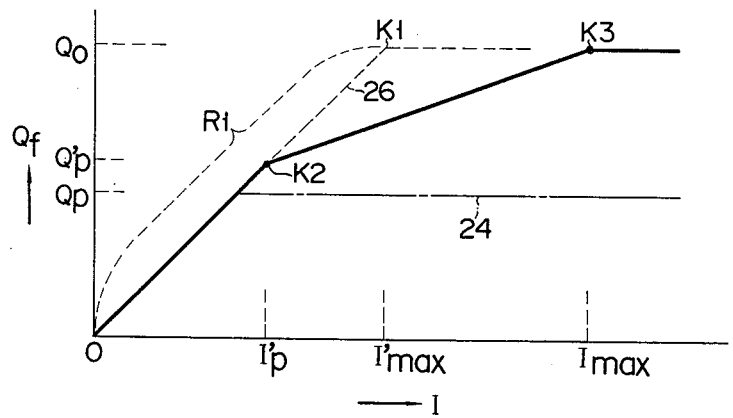
FIG. 6 illustrates an example of the photoelectric conversion characteristic obtained from the charge transfer device of the invention.

If $$I > \frac{Qo}{to},$$

the potential well will be saturated before arrival at the point of time P4, so that Qf = Qo. Said Qf is drawn out from the terminal 16 of FIG. 1-A as a video signal. As apparent from the photoelectric conversion characteristic line R1 of FIG. 6 illustrating the relationship between I and Qf, the amount of integrated carriers Qf at the point of time P4 is increased proportionally to I, and when I becomes larger than $$\frac{Qo}{to},$$

the potential well becomes saturated. The knee point K1 (see FIG. 6) of the photoelectric conversion characteristic curve in this case is shown as an intersection between Qo and I′ max.. In the range of line R1, the γ (gamma) value is substantially 1. As seen also from the equation (2), unless the integration period to given for the respective integration electrodes is independently varied relative to I, the γ value remains 1. However, since, as shown in FIG. 1-A, the electrode conductor φ1 is connected in common to the respective integration electrodes and I varies with a variation in the substrate portion where image focussing is effected, it is impossible to vary the integration period to for each such substrate portion. Accordingly, the prior art "CCD" fails to allow the photoelectric conversion characteristic to have a knee pattern.

Figure 7:
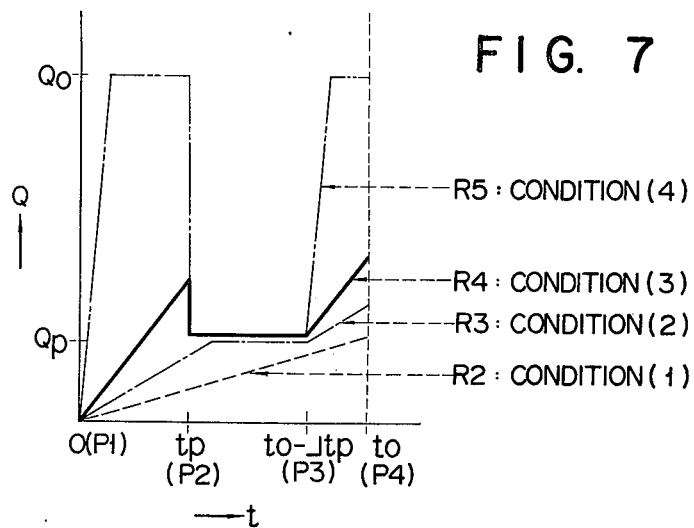
FIG. 7 illustrates the relationship of the amount of carrier integrated with time, per condition of irradiated light intensity, which is established where carrier integration is performed by applying a driving voltage having the waveform illustrated in FIG. 4-A to the charge transfer device illustrated in FIG. 3.

Next, the function of the charge transfer device of the invention is described. In FIG. 4-A, the amount of carriers Qp integrated during the period from P2 to P3 can be expressed by Cox (Vp − $V_0$). FIG. 7 illustrates the relationship between the amount of carriers Q integrated in a potential well during the period from P1 to P4 and time, showing four characteristic curves corresponding to four conditions of I as later described.

$$\text{Condition (1): } I < \frac{Qp}{to - \Delta tp} < \frac{Qo}{to}$$

The integration process of Q in this case is indicated by a dotted line R2. Since the amount of carriers Q integrated is smaller than the maximum permissible amount of carriers Qo integrated throughout the period to, the amount of integrated carriers Qf at the point of time P4 can be expressed by the following equation (3).

$$Qf = I \times to \ldots \quad (3)$$

Unless the inequality of $$\frac{Qp}{to - \Delta tp} < \frac{Qo}{to}$$

is satisfied, the I - Qf characteristic becomes a prior art one (R1 of FIG. 6) wherein the potential well is saturated when $$I = \frac{Qo}{to}.$$

Accordingly where, in the present invention, it is desired to allow the photoelectric conversion characteristic to have a knee pattern, it is necessary that there exists a relationship satisfying said inequality in between Qp and $\Delta tp$.

Condition (2): $\quad \dfrac{Qp}{to - \Delta tp} \leqq \dfrac{Qp}{tp}$

This case corresponds to a curve R3 of FIG. 7. As a result of carrier integration during the period from P1 to P2, the amount of integrated carriers at the point of time P2 is Qp, and the amount of carriers integrated during the period from P2 to P3 is maintained to be Qp and is again increased after the point of time P3. Thus, the amount of integrated carriers Qf at the point of time P4 can be expressed by the equation:

$$Qf = I\Delta tp + Qp \ldots \quad (4)$$

Condition (3): $\quad \dfrac{Qp}{tp} \leqq I \leqq \dfrac{Qo}{\Delta tp}$

The integration process of Q in this case is indicated by a curve R4 of FIG. 7. The amount of integrated carriers at the point of time P2 is larger than the amount of carriers Qp. The carriers of the amount exceeding Qp at the point of time P2 are diffused into the semiconductor substrate, while the amount of carriers integrated during the period from P2 to P3 is maintained to be Qp. Accordingly, the amount of integrated carriers Qf at the point of time P4 can be expressed by the same equation as the above-mentioned equation (4). Namely, $$Qf = I\Delta tp + Qp$$

From this equation it is seen that the position of P2 has no relevance to the amount of integrated carriers Qf at the terminating point P4.

Condition (4): $\quad \dfrac{Qo}{\Delta tp} \leqq I$

The integration process of Q in this case is indicated by a curve R5 of FIG. 7. The amount of carriers integrated reaches Qo within the period from P1 to P2, but is maintained to be Qp during the period from P2 to P3, and is again increased after P3 to reach the saturation value Qo before arrival at P4, and thereafter is maintained to be Qo. Accordingly, Qf can be expressed by the equation:

$$Qf = Qo \ldots \quad (5)$$

Qualitatively synthesizing the foregoing equations (3) to (5), the photoelectric conversion characteristic curve (0 - K2 - K3) indicated by a solid line of FIG. 6 is obtained. The knee point K2, when $$I = Ip' = \frac{Qp}{to - \Delta tp},$$

is produced, and the amount of integrated carriers Qf at P4 in that case is equal to Qp' which is expressed by the following equation (6) obtained from substitution of said Ip' for the I of the equation (3).

$$Qp' = \frac{to}{to - \Delta tp} Qp \quad (6)$$

As above described, Qp is expressed by the previously expressed equation $Qp = Cox (Vp - V_0)$. Further, the amount of the knee pattern (the inclination of the line K2 – K3 of FIG. 6) is determined by $\Delta tp$ of the equation (4). Further, the amount of integrated carriers Qp' (the equation (6)) at the knee point K2 is determined by the voltage amplitude (Vp of FIG. 4-A) at the terminating point P3 of the previously mentioned initial period. Accordingly, where it is desired to obtain a prescribed photoelectric conversion characteristic having a knee pattern, $\Delta tp$ is first so set as to allow the knee pattern to have a predetermined inclination (line K2 – K3 of FIG. 6) and then the voltage amplitude at the terminating point P3 of the initial period has only to be set to a prescribed value so as to determine the knee point (Qp' of FIG. 6).

The other knee point K3 of FIG. 6 is produced correspondingly to the above-mentioned saturation value Qo, and I at the knee point K3 is expressed by I max.. The saturation characteristic indicated by a dot-and-dash line is obtained where the period $\Delta tp$ is zeroed, that is, where the voltage having a level of Vp is continuously applied to the integration electrodes also during the period $\Delta tp$, and the amount of integrated carriers Qf corresponding to said saturation characteristic is equal to Qp.

Figure 8:
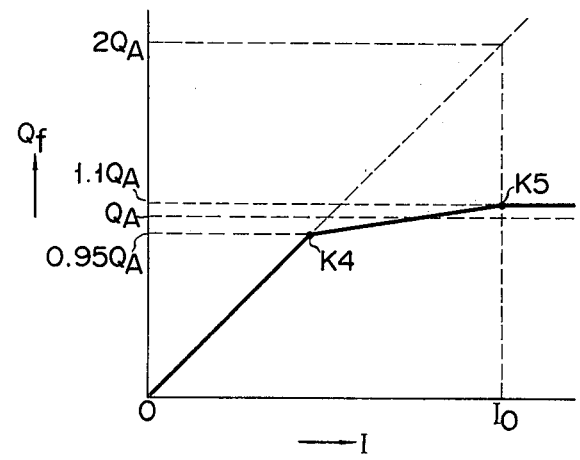
FIG. 8 is a graphic diagram for explaining the condition for making the knee characteristic curve of the present device and an example of the knee characteristic curve of a prior art image pickup tube similar to each other.

FIG. 8 is a graphic diagram for obtaining by the present device the substantially same photoelectric conversion characteristic as that (which is indicated by a solid line 0 - K4 - K5) obtainable by a prior art color television camera. The knee point K4 is situated at a level equal to 95% of the level QA (which is expressed by the amount of integrated carriers at the point P4 of FIG. 4-A) of the average output signal QA. The dotted line 26 corresponds to the case where the $\gamma$ value is assumed to be 1. If, in case $I = Io$, saturation is achieved wherein the output signal has a level of 1.1QA, the knee point K5 will be produced at the point (Io, 1.1QA). If, as above described, the $\gamma$ value is assumed to be 1, the signal level at the time of $I = Io$ becomes QA. Where it is desired to obtain the foregoing photoelectric conversion characteristic (0 - K4 - K5), the voltage level $V_2$ of FIG. 4-A has only to be so determined as to satisfy the equation of $Qo = 1.1QA = Cox (V_2 - V_0)$. If, in case the voltage level $V_2$ is determined as such, $$I = \frac{2QA}{to},$$

$Qf = Qo$. The QA can be expressed as follows.

$$QA = \frac{1}{1.1} \left\{ \frac{2QA}{to} \Delta tp + Qp \right\} \quad (7)$$

The amount of integrated carriers Qp' at the knee point K2 of the equation (6) and FIG. 6 corresponds to the amount of integrated carriers 0.95QA at the knee point K4 of FIG. 8. Accordingly, the following equation is obtained using the equation (6).

$$Qp = 0.95 \frac{to - \Delta tp}{to} QA \qquad (8)$$

Substituting the equation (8) in the equation (7), the data $\Delta tp$ and Qp for determining the waveform of the integration voltage illustrated in FIG. 4-A can be expressed as follows.

$$\left. \begin{array}{l} \Delta tp = \frac{1}{7} to \\ Qp = \frac{57}{70} QA \end{array} \right\} \qquad (9)$$

Let's consider the waveform of the integration voltage illustrated in FIG. 4-A. The period tp form P1 to P2 has no relevance to the position of the knee point of the photoelectric conversion characteristic and the inclination of the characteristic curve portion succeeding said knee point. Accordingly, the period from P2 to P3 may have a small length.

Figure 9:
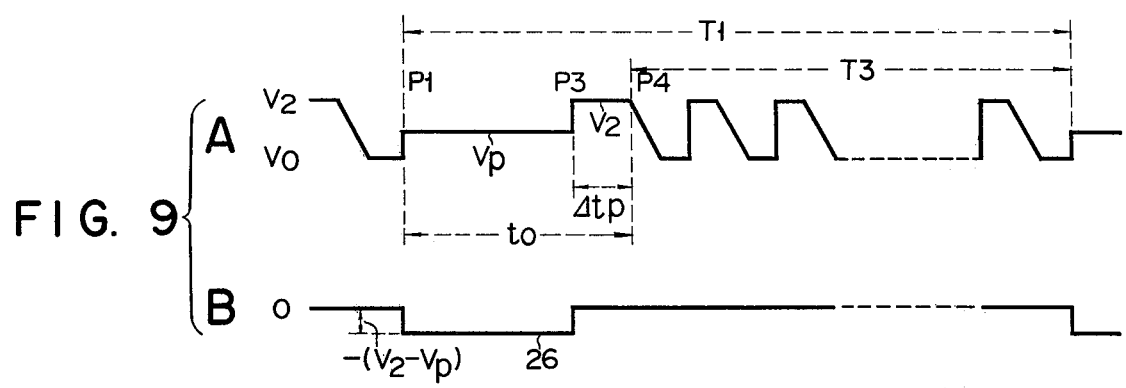
FIG. 9-A illustrates a modification of the integration voltage waveform illustrated in FIG. 4-A and FIG. 9-B shows a waveform for obtaining the waveform of FIG. 9-A.

Next, another modification of the integration voltage waveform of the present invention is described by reference to FIG. 9. This waveform is one obtained by zeroing the period tp of the integration voltage waveform illustrated in FIG. 4-A. The waveform of FIG. 9-A is obtained by mixing the waveform illustrated in FIG. 5-A with that illustrated in FIG. 9-B by the mixer 20. In this case, the knee pattern can be varied by varying the level and width of the pulse 26 illustrated in FIG. 9-B. A pulse width modulation circuit (PWM circuit) using a multivibrator circuit is used as corresponding to the control source 21 (FIG. 3). In this embodiment, the integration voltage having the level Vp meeting the requirement of $V_0 < Vp < V_2$ is applied during the initial period (to − $\Delta tp$), and the voltage having the maximum level $V_2$ of a driving voltage is applied during the remaining integration period $\Delta tp$. The waveform of this embodiment produces the same effect as that attainable by the waveform illustrated in FIG. 4-A.

Figure 10:
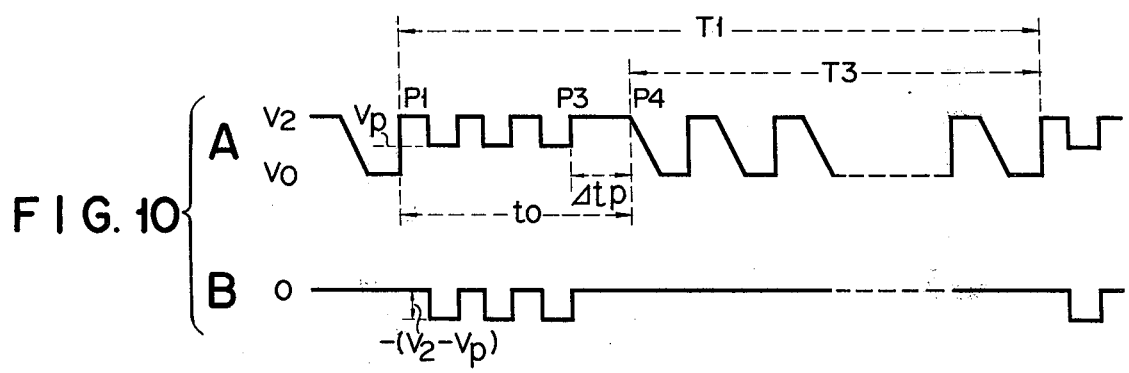
FIG. 10-A illustrates another modification of the integration voltage waveform illustrated in FIG. 4-A and FIG. 10-B shows a waveform for obtaining the waveform of FIG. 10-A.

A still another modification of the waveform of the integration voltage is illustrated in FIG. 10-A. This waveform includes a plurality of pulses which vary from the maximum level $V_2$ to the minimum level Vp during the initial integration period (to − $\Delta tp$). The waveform including said plurality of pulses can be obtained simply by using in replacement of the control source 21 (FIG. 3) a pulse generator for generating pulses each varying from 0V to −($V_2$ − Vp) as illustrated in FIG. 10-B and mixing the pulse from said pulse generator with the voltage waveform illustrated in FIG. 2-A.

Figure 11:
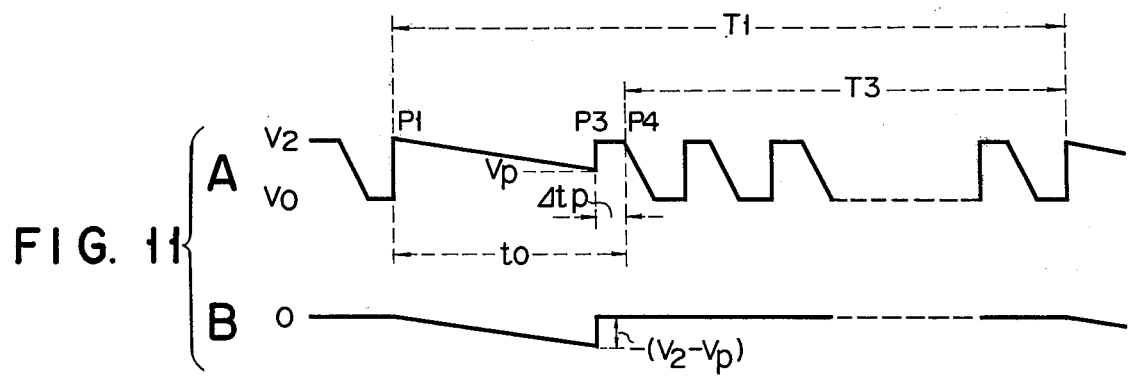
FIG. 11-A illustrates still another modification of the integration voltage waveform illustrated in FIG. 4-A, and FIG. 11-B shows a waveform for obtaining the waveform of FIG. 11-A.

A still another modification of the waveform of the integrating voltage is illustrated in FIG. 11-A. As shown, the integration voltage waveform applied during the initial period (to − $\Delta tp$) is linearly varied from the amplitude level $V_2$ at P1 to the amplitude level Vp at P3. In this case, the waveform to be mixed with the waveform illustrated in FIG. 2-A is given by the waveform varying from the amplitude level 0 at P1 to the amplitude level −($V_2$ − Vp) at P3 in a linear fashion.

The foregoing description referred to the case with the P channel −3 phase driving type "CCD", but this invention is not limited to the foregoing type of channel and the foregoing phase of the driving source. Further, this invention is applicable to a charge transfer device having two-dimensional electrode arrangement as well as to that having one dimensional electrode arrangement.

What we claim is:

1. An operation system to control the photoelectric conversion characteristics of a charge transfer device comprising a semiconductor substrate provided with a plurality of electrodes for carrier integration and transference, integration means for integrating within an integration period the carriers produced in said substrate in increasingly corresponding relationship to the intensity of light incident into said substrate by applying an integration voltage to said electrodes for carrier integration, and transfer and readout means for transferring the integrated carriers by applying when carrier transferring is performed, a transfer voltage to said electrodes for carrier transference and sequentially reading out the transferred carriers as video signals, characterized in that it further comprises means for applying a first integration voltage having a prescribed level to said electrodes for carrier integration during a prescribed length of initial period of said integration period, and means for applying during the remaining integration period a second integration voltage having a level higher than the first integration voltage level at the terminating time point of said initial period to said electrodes for carrier integration.

2. An operational system to control the photoelectric conversion characteristics of a charge transfer device according to claim 1 wherein said transfer voltage has the maximum and minimum voltage levels represented by $V_2$ and $V_0$, respectively, and the voltage level $V_p$ of said first integration voltage at the terminating time point of said initial period satisfies the condition of $V_0 < V_p < V_2$.

3. An operation system to control the photoelectric conversion characteristics of a charge transfer device according to claim 2 wherein said first integration voltage is maintained to have said maximum voltage level $V_2$ during a first prescribed period beginning with the starting point of said initial period and maintained to have said voltage level $V_p$ during a second period immediately succeeding said first period.

4. An operation system to control the photoelectric conversion characteristics of a charge transfer device according to claim 2 wherein said first integration voltage is maintained to have said voltage level $V_p$ during said initial period.

5. An operation system to control the photoelectric conversion characteristics of a charge transfer device according to claim 2 wherein said first integration voltage consists of a plurality of pulses whose maximum and minimum voltage levels are said $V_2$ and said $V_p$, respectively and has said voltage level $V_p$ at the terminating time point of the initial period.

6. An operation system to control the photoelectric conversion characteristics of a charge transfer device according to claim 2 wherein said first integration voltage has said voltage level $V_2$ and said voltage level $V_p$ at the starting point and terminating point, respectively, of said initial period and has its voltage level varying from said $V_2$ to said $V_p$ in a linear fashion.

* * * * *